United States Patent [19]

Rocheleau et al.

[11] 4,315,219
[45] Feb. 9, 1982

[54] AMPLITUDE CONTROLLED DIGITAL OSCILLATOR

[75] Inventors: David Rocheleau; Karl Ayukawa, both of Ottawa, Canada

[73] Assignee: Canadian Patents & Development Limited, Ottawa, Canada

[21] Appl. No.: 138,176

[22] Filed: Apr. 7, 1980

[51] Int. Cl.³ .......................................... H03K 13/02
[52] U.S. Cl. ................................... 328/14; 331/183; 364/607
[58] Field of Search ...................... 328/14; 331/183; 364/607

[56] References Cited

U.S. PATENT DOCUMENTS

| | | | |
|---|---|---|---|
| 2,103,619 | 12/1937 | Hallmark | 331/183 |
| 2,451,021 | 10/1948 | Detuno | 331/183 |
| 3,772,681 | 11/1973 | Skingle | 364/607 |
| 4,039,806 | 8/1977 | Fredriksson et al. | 328/14 |

Primary Examiner—Alfred E. Smith
Assistant Examiner—T. N. Grigsby
Attorney, Agent, or Firm—Edward Rymek

[57] ABSTRACT

The digital oscillator includes a memory which stores 12 bit words representing sampling points of the analog waveform to be produced and a D/A multiplying converter which receives the bit words and converts them to an analog values, the amplitudes of which are controlled by a reference voltage. The analog output is monitored and compared to a stable reference source in order to generate the controlling reference voltage thus maintaining a constant amplitude digital oscillator output.

5 Claims, 2 Drawing Figures

AMPLITUDE CONTROLLED DIGITAL OSCILLATOR

BACKGROUND OF THE INVENTION

This invention is directed to a digital oscillator and in particular to a digital oscillator having high amplitude stability.

Analog oscillators have been perfected so as to have high amplitude stability with a satisfactory sine waveform. For example, the Wien bridge oscillator when constructed from very high stability components and/or with stabilizing circuits and filters can provide an acceptable output. However, these oscillators are expensive and are not readily frequency variable.

Many digital oscillators have been developed which with filters also provide a satisfactory waveform, however their amplitude is not particularly stable and therefore these oscillators cannot be used in measurement circuits without incurring unwanted error.

SUMMARY OF THE INVENTION

It is therefore an object of this invention to provide a digital oscillator having high amplitude stability of its output.

This and other objects are achieved in a digital oscillator which includes a digital to analog multiplying converter which multiplies a parallel binary number by a reference signal to produce an analog output, and a memory which stores a desired waveform in binary numbers, coupled to the converter. A timing and control circuit drives the memory to sequentially transfer binary numbers to the converter at a desired rate. A detector is coupled to the converter output to monitor the amplitude of the analog output and thereby control the reference signal to the converter.

In accordance with another aspect of this invention, the detector may include a sample and hold circuit which samples the analog output under the control of the control circuit and a stable reference source. The sample and hold circuit sample is compared to the stable reference source output to generate the reference voltage for the converter. The sample and hold circuit may be a peak value detector to sample the analog output once during each cycle, and the reference source may be a voltage source.

Many other objects and aspects of the invention will be clear from the detailed description of the drawings.

DETAILED DESCRIPTION OF THE EMBODIMENTS

Figure 1:
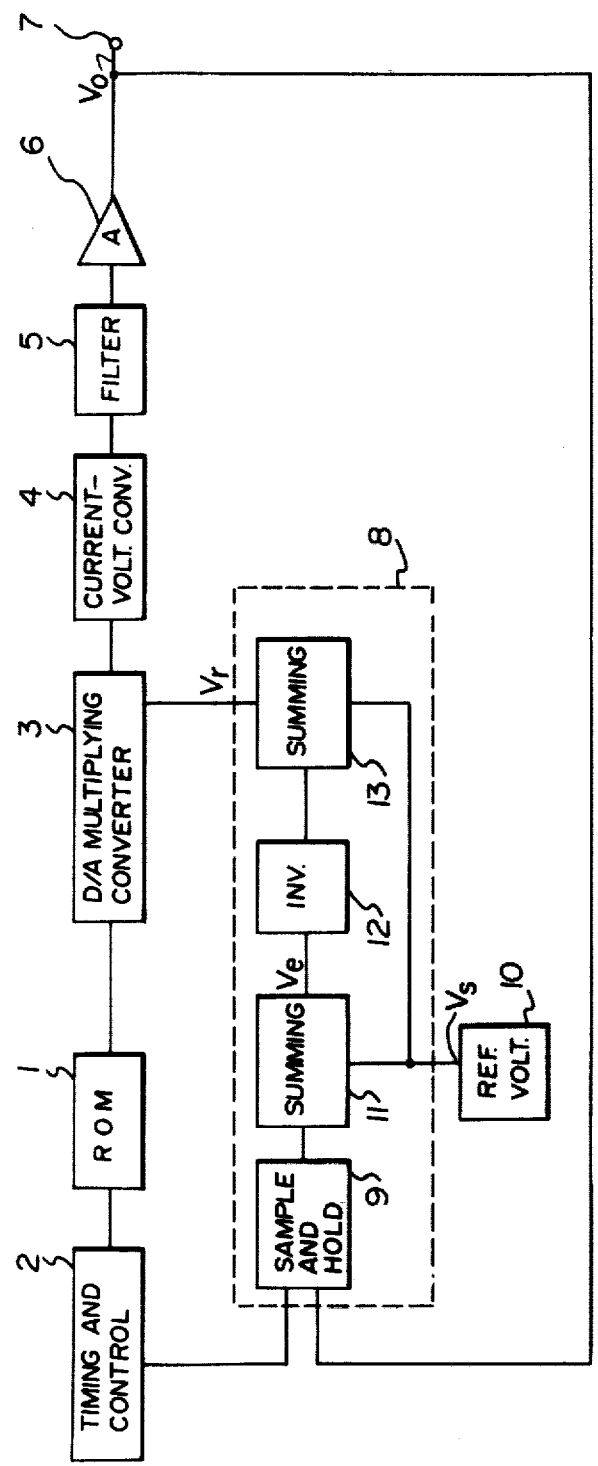
FIG. 1 illustrates the digital oscillator in accordance with the present invention.

The digital oscillator in accordance with the present invention is described with reference to FIG. 1.

Sample points of the waveform which is to be reproduced as an oscillation, are stored as binary numbers in a read only memory (ROM) 1 which is controlled by a timing and control circuit 2. For symmetric waves, and in particular sine waves, these numbers are calculated using a Fourier odd ¼-wave symmetry coefficients series. ROM 1 may, however, store sample points of one entire cycle of the desired oscillation, or ½ cycle or ¼ cycle if the waveform is half-wave or quarter-wave symmetrical. In all of the cases, the control circuit sequentially reads through the sample points, and depending on the type of storage, this will occur either once, twice or four times for each cycle with the proper inversion and reversal made as required to reconstruct the entire waveform.

The number of sample points per cycle will depend on the quality of reproduced waveform required, as well as the type of waveform desired, i.e. a square wave would require many fewer points than a more complex waveform such as a sine wave. In the present case, the number of sampling points per ¼ waveform to reproduce a pure sine wave is set at 64 samples. In order to obtain a sine wave with little distortion at the output and with very little filtering if at all, the sample points are selected using the following method.

Figure 2:
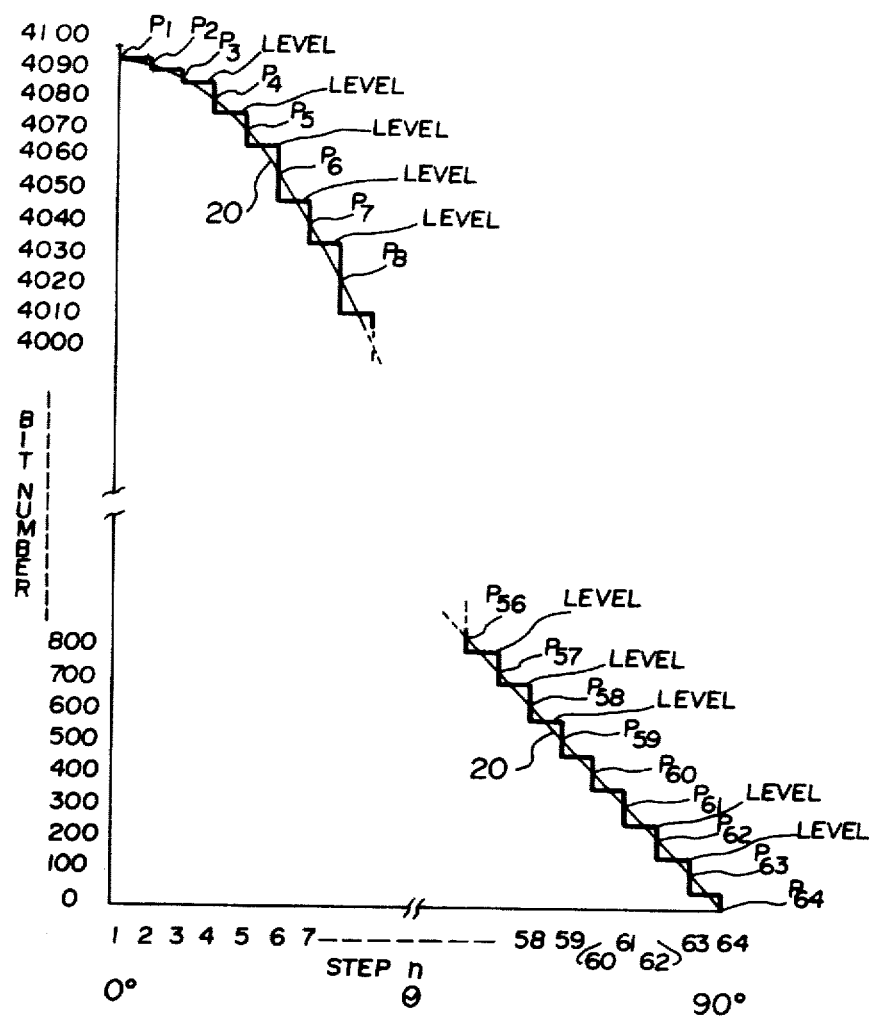
FIG. 2 illustrates the approximation of a sine-wave by stepped levels.

The sine wave 20 is approximated by a series of stepped levels, with the level difference at each step 1, 2, 3, . . . being calculated as a function of the angular position number $P_n$ where $P_n = (\text{cosine } \theta_n \times \text{maximum bit number})$. In the example illustrated in FIG. 2, $1 \leq n \leq 64$ and the maximum bit number, which is dependent on the word size of 12 bits, is equal to 4096. The binary value of a level is determined by taking the difference between the binary value of the proceeding level and $P_n$, and subtracting this difference value from the number $P_n$ at that step. In this way, the levels immediately proceeding and following a step are equally spaced above and below $P_n$ at that step. Though 8 bit binary numbers can represent the sample points quite satisfactorily, 12 bit binary numbers are preferably used as no filtering of the output signal is required even when a relatively pure sine wave is required. In this manner, only the timing rate of the digital system need be varied to vary the output frequency, and output filters need not be changed.

The binary words representing the sample points are fed to a digital to analog multiplying converter 3 which converts each binary word to an analog value. The analog value of the output of a multiplying converter depends directly on the reference voltage $V_r$ applied to it. The converter 3 may be of the type described as the DAC 1220 in the National Semiconductor Interface Handbook, 1979, on I/O devices, section 3, pages 18 to 27.

The converter output is fed to a current-to-voltage converter 4 which may also set the zero voltage level such that the output oscillates above and below the zero value. The circuit may also include a filter 5 and an amplifier 6. However, the purity of the signal from converter 4 may be such that filter 5 is redundant. The oscillator output is taken from terminal 7.

The stability of the amplitude of the output at terminal 7 will depend on many factors such as temperature, the components, etc. In order to maintain a constant amplitude, the reference voltage $V_r$ is controlled by an error correction circuit 8. Error correction circuit 8 includes a sample and hold circuit 9 which samples the output 7 and holds the sample value under the control of timing circuit 2. For simplicity, the sample and hold circuit 9 may be triggered by timing circuit 2 to sample once per cycle at the peak value of the oscillator, however, sampling may also be carried out at other points on the waveform and/or more often.

The output from the sample and hold circuit 9, as well as the output $V_s$ from a stable reference voltage source 10 are both fed to a summing circuit 11 which provides $\pm V_e$, the error in the output amplitude at terminal 7. This error voltage is inverted in inverter 12 and combined with the stable reference voltage from source 10 in a second summing circuit 13 to provide the control reference voltage $V_r = V_s \pm V_e$. In this manner, when $V_o$ is equal to $V_s$, $V_e$ is zero and $V_r = V_s$; when $V_o$ is high, $V_o > V_r$, $V_e$ is positive, is inverted and adds with $V_s$ such that $V_r = V_s - V_e$ to bring down the output $V_o$; and when $V_o$ is low, $V_o < V_r$, $V_e$ is negative, is inverted and adds with $V_s$ such that $V_r = V_s + V_e$ to bring up the output $V_o$.

Many modifications in the above described embodiments of the invention can be carried out without departing from the scope thereof and therefore the scope of the present invention is intended to be limited only by the appended claims.

We claim:

1. A digital oscillator comprising:
   digital to analog multiplying converter means for multiplying a parallel binary number by a reference signal to produce an analog output;
   memory means for storing a desired waveform in binary numbers, said memory means coupled to the converter means;
   control means for driving the memory means to sequentially transfer binary numbers to the converter means at a desired rate; and
   detector means coupled to the converter means output for monitoring the amplitude of the analog output and for controlling the reference signal to the converter means.

2. An oscillator as claimed in claim 1 wherein the detector means includes:
   sample and hold circuit means for sampling the analog output under the control of the control means;
   stable reference source means; and
   means connected to the sample and hold circuit means and the stable reference source means for providing the reference signal to the converter means.

3. An oscillator as claimed in claim 2 wherein the sample and hold circuit means is a peak value detector for sampling the analog output once during each cycle.

4. An oscillator as claimed in claim 2 wherein the digital to analog converter means output is a current and the oscillator includes a current to voltage converter means coupled to the digital to analog converter means for converting the output current to an output voltage.

5. An oscillator as claimed in claims 2, 3 or 4 wherein the reference source means is a voltage source.

* * * * *